US012628386B2

(12) United States Patent (10) Patent No.: US 12,628,386 B2

Suganuma et al. (45) Date of Patent: May 12, 2026

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Nao Suganuma, Matsumoto (JP); Yosuke Sakurai, Azumino (JP); Seiji Noguchi, Matsumoto (JP); Ryutaro Hamasaki, Matsumoto (JP); Takuya Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 304 days.

(21) Appl. No.: 18/357,164

(22) Filed: Jul. 24, 2023

(65) Prior Publication Data

US 2024/0072110 A1 Feb. 29, 2024

(30) Foreign Application Priority Data

Aug. 31, 2022 (JP) ................................. 2022-138195

(51) Int. Cl.
H10D 62/10 (2025.01)
H01L 21/265 (2006.01)
(Continued)

(52) U.S. Cl.
CPC ....... H10D 62/109 (2025.01); H01L 21/2652 (2013.01); H10D 12/038 (2025.01);
(Continued)

(58) Field of Classification Search
CPC .. H10D 62/109; H10D 12/038; H10D 12/481; H10D 62/107; H10D 62/393;
(Continued)

(56) References Cited

U.S. PATENT DOCUMENTS 9,653,568 B2 5/2017 Laven
2018/0350961 A1 12/2018 Naito
(Continued)

FOREIGN PATENT DOCUMENTS

JP H08316479 A * 11/1996
WO 2018030440 A1 2/2018
(Continued)

OTHER PUBLICATIONS

Office Action issued for counterpart Japanese Application No. 2022-138195, transmitted from the Japanese Patent Office on Mar. 31, 2026 (drafted on Mar. 27, 2026).

*Primary Examiner* — Syed I Gheyas

(57) ABSTRACT

Provided is a semiconductor device including a transistor portion, in which the transistor portion has a drift region of a first conductivity type provided in a semiconductor substrate, a base region of a second conductivity type provided above the drift region, an accumulation region of the first conductivity type provided above the drift region, a plurality of trench portions provided to extend from a front surface of the semiconductor substrate to the drift region, and a trench bottom portion of the second conductivity type provided in bottom portions of the plurality of trench portions, and the accumulation region has a doping concentration with a half width of 0.3 μm or more.

10 Claims, 10 Drawing Sheets

(51) Int. Cl.
| | | |
|---|---|---|
| *H10D 12/00* | (2025.01) | |
| *H10D 12/01* | (2025.01) | |
| *H10D 62/17* | (2025.01) | |

(52) U.S. Cl.
CPC ......... *H10D 12/481* (2025.01); *H10D 62/107* (2025.01); *H10D 62/393* (2025.01)

(58) Field of Classification Search
CPC .. H10D 62/106; H10D 62/127; H10D 62/142; H10D 64/117; H01L 21/2652; H01L 21/761

See application file for complete search history.

(56) References Cited

U.S. PATENT DOCUMENTS

| | | | | |
|---|---|---|---|---|
| 2019/0157381 | A1* | 5/2019 | Naito | H10D 62/142 |
| 2020/0287031 | A1* | 9/2020 | Naito | H01L 21/324 |
| 2021/0074850 | A1* | 3/2021 | Tawara | H01L 21/049 |
| 2021/0226053 | A1* | 7/2021 | Hoshi | H10D 30/669 |
| 2021/0384332 | A1 | 12/2021 | Sakurai | |
| 2022/0271132 | A1* | 8/2022 | Karmous | H10D 64/231 |
| 2023/0124922 | A1 | 4/2023 | Ozaki | |

FOREIGN PATENT DOCUMENTS

| | | | |
|---|---|---|---|
| WO | 2021049351 | A1 | 3/2021 |
| WO | 2022158053 | A1 | 7/2022 |

* cited by examiner a-a'
100

SEMICONDUCTOR DEVICE AND MANUFACTURING METHOD OF SEMICONDUCTOR DEVICE

The contents of the following patent application(s) are incorporated herein by reference: NO. 2022-138195 filed in JP on Aug. 31, 2022

BACKGROUND

1. Technical Field

The present invention relates to a semiconductor device and a manufacturing method of a semiconductor device.

2. Related Art

Patent Document 1 discloses an IGBT provided with a second portion 172 of an n+ type having an impurity concentration higher than a first portion 171 of an n− type. Patent Document 2 discloses an insulated gate semiconductor device provided with an N layer 43 having an impurity concentration higher than an N− layer 42 between the N− layer 42 and a P base layer 44.

PRIOR ART DOCUMENT

Patent Document

Patent Document 1: Specification of U.S. Pat. No. 9,653,568
Patent Document 2: Japanese Patent Application Publication No. H08-316479

DESCRIPTION OF EXEMPLARY EMBODIMENTS

Figure 1:
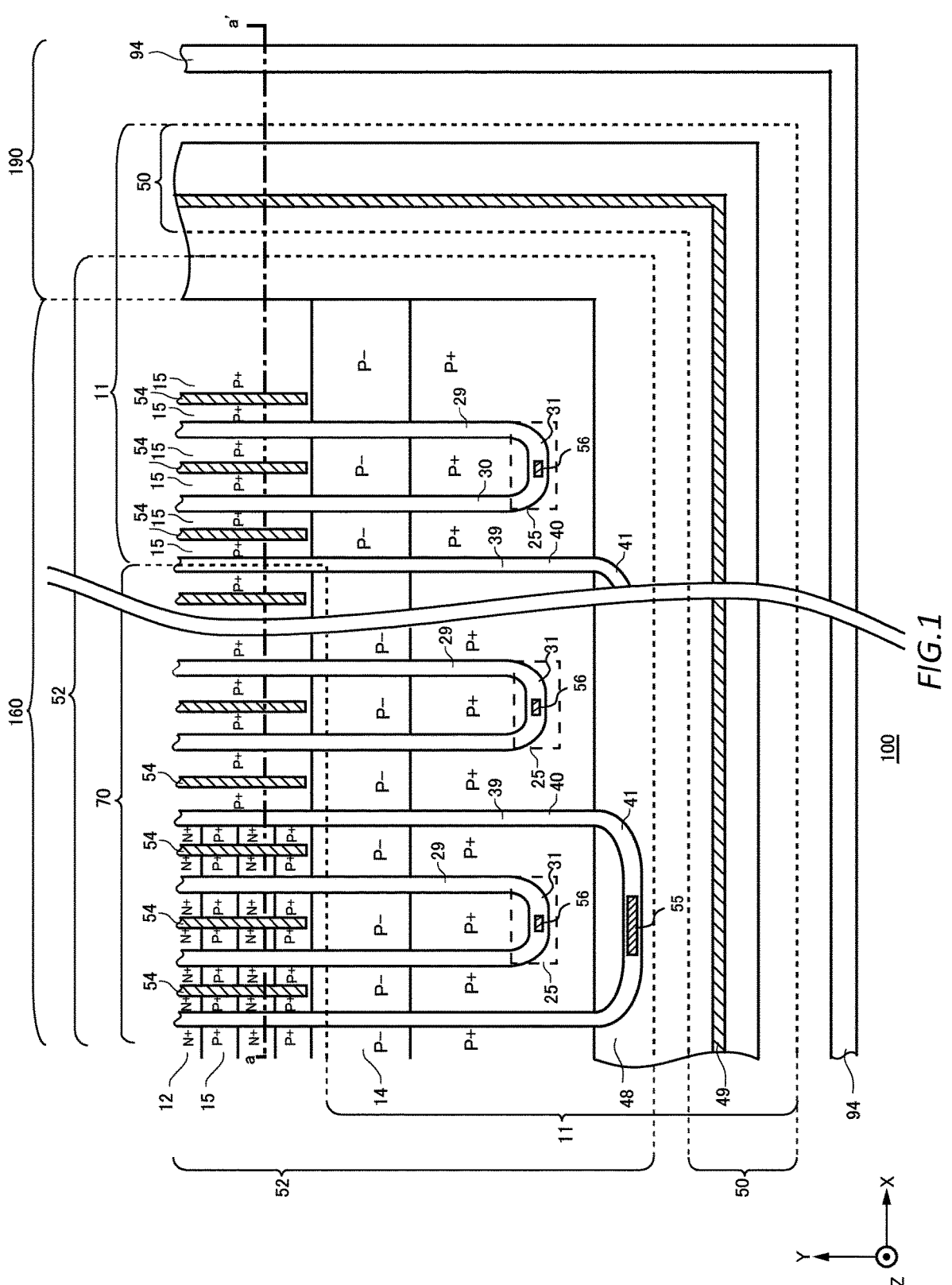
FIG. 1 is a figure showing an example of an upper surface of a semiconductor device 100 according to an example embodiment.

Hereinafter, embodiments of the present invention will be described. However, the following embodiments are not for limiting the invention according to the claims. In addition, not all of the combinations of features described in the embodiments are essential to the solution of the invention.

In the present specification, one side in a direction parallel to a depth direction of a semiconductor substrate is referred to as 'upper' or 'front' and the other side is referred to as 'lower' or 'back'. One surface of two principal surfaces of a substrate, a layer, or another member is referred to as a front surface, and the other surface is referred to as a back surface. "Upper" and "lower" directions are not limited to a direction of gravity, or a direction in which a semiconductor device is mounted.

As used herein, technical matters may be described with orthogonal coordinate axes consisting of an X axis, a Y axis, and a Z axis. The orthogonal coordinate axes are merely for specifying relative positions of components, and are thus not for limiting to a specific direction. For example, the Z axis is not limited to representing a height direction with respect to the ground. Note that a +Z axis direction and a −Z axis direction are directions opposite to each other. When a direction is referred to as a "Z axis direction" without these "+" and "−" signs, it means the Z axis direction is parallel to +Z and −Z axes.

In the present specification, orthogonal axes parallel to the front surface and the back surface of the semiconductor substrate are referred to as the X axis and the Y axis. In addition, an axis perpendicular to the front surface and the back surface of the semiconductor substrate is referred to as the Z axis. As used herein, a direction of the Z axis may be referred to as a depth direction. In addition, in the present specification, a direction parallel to the front surface and the back surface of the semiconductor substrate, including the X axis and the Y axis, may be referred to as a horizontal direction.

As used herein, phrases such as "same" or "equal" may be used even when there is an error caused due to a variation in a manufacturing step or the like. This error is within a range of 10% or less, for example.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor showing the conductivity type of the N type, or a semiconductor showing the conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is referred to as $N_D$ and the acceptor concentration is referred to as $N_A$, the net doping concentration at any position is given as $N_D - N_A$.

The donor has a function of supplying electrons to a semiconductor. The acceptor has a function of receiving the electrons from the semiconductor. The donor and the acceptor are not limited to impurities themselves. For example, a VOH defect which is a combination of a vacancy (V), oxygen (O), and hydrogen (H) existing in the semiconductor functions as the donor that supplies the electrons.

A P+ type or an N+ type described in the present specification means a doping concentration higher than that of the P type or the N type, and a P− type or an N− type described herein means a doping concentration lower than that of the P type or the N type. In addition, a P++ type or an N++ type described in the present specification means a doping concentration higher than that of the P+ type or the N+ type.

In the present specification, a chemical concentration refers to a concentration of an impurity measured regardless of an electrical activation state. The chemical concentration can be measured by, for example, secondary ion mass spectrometry (SIMS). The net doping concentration described above can be measured by a capacitance-voltage profiling method (CV method). In addition, a carrier concentration measured by a spreading resistance profiling method (SR method) may be set as the net doping concentration. The carrier concentration measured by the CV method or the SR method may be set as a value in a thermal equilibrium state. In addition, in a region of the N type, the donor concentration is sufficiently higher than the acceptor concentration, and therefore, the carrier concentration in the region may be set as the donor concentration. Similarly, in a region of the P type, the carrier concentration in the region may be set as the acceptor concentration.

In addition, when a concentration distribution of the donor, acceptor, or net doping has a peak, a value of the peak may be set as the concentration of the donor, acceptor, or net doping in the region. When the concentration of the donor, acceptor, or net doping is approximately uniform in a region, or the like, an average value of the concentration of the donor, acceptor, or net doping in the region may be set as the concentration of the donor, acceptor, or net doping.

The carrier concentration measured by the SR method may be lower than the concentration of the donor or the acceptor. In a range where a current flows when a spreading resistance is measured, the carrier mobility of the semiconductor substrate may be lower than a value of that in a crystalline state. The decrease in carrier mobility occurs when carriers are scattered due to disorder (disorder) of a crystal structure due to a lattice defect or the like.

The concentration of the donor or the acceptor calculated from the carrier concentration measured by the CV method or the SR method may be lower than a chemical concentration of an element representing the donor or the acceptor. As an example, in a silicon semiconductor, a donor concentration of phosphorus or arsenic serving as a donor or an acceptor concentration of boron (boron) serving as an acceptor is substantially 99% of chemical concentrations of these. On the other hand, in the silicon semiconductor, a donor concentration of hydrogen serving as a donor is approximately from 0.1% to 10% of a chemical concentration of hydrogen.

FIG. 1 is a figure showing an example of an upper surface of a semiconductor device 100 according to an example embodiment. FIG. 1 shows a position at which each member is projected onto the front surface of semiconductor substrate. In FIG. 1, only some members of the semiconductor device 100 are shown, and illustrations of some members are omitted.

The semiconductor device 100 includes the semiconductor substrate. A top view as referred to herein means a view from a front surface side of the semiconductor substrate. The semiconductor substrate of the present example has two sets of end sides opposite to each other in the top view. In FIG. 1, the X axis and the Y axis are parallel to any of the end sides. In addition, the Z axis is perpendicular to the front surface of the semiconductor substrate.

The semiconductor substrate is provided with an active portion 160. The active portion 160 is a region where a main current flows in the depth direction between the front surface and the back surface of the semiconductor substrate when the semiconductor device 100 is operated.

The active portion 160 is provided with a transistor portion 70 including a transistor element such as the IGBT. The active portion 160 may further be provided with a diode portion including a diode element such as a freewheeling diode (FWD). In the transistor portion 70, an emitter region of the N type, a base region of the P type, and a gate structure having a gate conductive portion and a gate dielectric film are periodically arranged in the front surface side of the semiconductor substrate.

The semiconductor device 100 may have one or more pads above the semiconductor substrate. The semiconductor device 100 may have a pad such as a gate pad, an anode pad, a cathode pad, and a current detection pad. Each pad is arranged in to the vicinity of an end side. The vicinity of the end side refers to a region between the end side and an emitter electrode in the top view. When the semiconductor device 100 is mounted, each pad may be connected to an external circuit via a wiring such as a wire.

A gate potential is applied to the gate pad. The gate pad is electrically connected to a conductive portion of a gate trench portion of the active portion 160. The semiconductor device 100 includes a gate runner 48 that electrically connects the gate pad and the gate trench portion.

The gate runner 48 is arranged between the active portion 160 and the end side of the semiconductor substrate in the top view. The gate runner 48 of the present example surrounds the active portion 160 in the top view. A region surrounded by the gate runner 48 in the top view may be set as the active portion 160.

The gate runner 48 is arranged above the semiconductor substrate. The gate runner 48 of the present example may be formed of polysilicon doped with the impurities, or the like. The gate runner 48 is electrically connected to the gate conductive portion provided in the gate trench portion via the gate dielectric film.

The semiconductor device 100 of the present example includes an edge termination structure portion 190 provided at an outer circumference of the active portion 160. The edge termination structure portion 190 of the present example is arranged between the gate runner 48 and the end side. The edge termination structure portion 190 relaxes electric field concentration in the front surface side of the semiconductor substrate.

The edge termination structure portion 190 may further include at least one of a field plate 94, and a RESURF which are annularly provided to surround the active portion 160. The field plate 94 may be formed of the same material as that of a gate metal layer 50 or an emitter electrode 52.

In addition, the semiconductor device 100 may include a temperature sensing portion (not shown) that is a PN junction diode formed of polysilicon or the like, and a current detection portion (not shown) that performs an operation similar to that of the transistor portion provided in the active portion 160.

The semiconductor device 100 includes a gate trench portion 40, a dummy trench portion 30, a well region 11, an emitter region 12, a base region 14, and a contact region 15 which are provided in the front surface side of the semiconductor substrate. The gate trench portion 40 and the dummy trench portion 30 are each an example of the trench portion.

In addition, the semiconductor device 100 of the present example includes the gate metal layer 50 and the emitter electrode 52 which are provided above the front surface of the semiconductor substrate. The gate metal layer 50 and the emitter electrode 52 are provided separately from each other. The gate metal layer 50 and the emitter electrode 52 are electrically insulated.

Although an interlayer dielectric film is provided between the emitter electrode 52 and the gate metal layer 50, and the front surface of the semiconductor substrate, it is omitted in FIG. 1. In the interlayer dielectric film of the present example, contact holes 49, 54, and 56 are provided to pass through the interlayer dielectric film. In FIG. 1, each contact hole is obliquely hatched.

The emitter electrode 52 is provided above the gate trench portion 40, the dummy trench portion 30, the well region 11, the emitter region 12, the base region 14, and the contact region 15. The emitter electrode 52 is electrically connected to the emitter region 12, the base region 14, and the contact region 15 at the front surface of the semiconductor substrate through the contact hole 54.

In addition, the emitter electrode 52 is connected to a dummy conductive portion in the dummy trench portion 30 through the contact hole 56. Between the emitter electrode 52 and the dummy conductive portion, a connection portion 25 formed of a conductive material such as polysilicon doped with the impurities may be provided. The connection portion 25 is provided at the front surface of the semiconductor substrate via a dielectric film such as the interlayer dielectric film and a dummy dielectric film of the dummy trench portion 30.

The gate metal layer 50 is electrically connected to the gate runner 48 through the contact hole 49. The gate runner 48 may be formed of polysilicon doped with the impurities, or the like. The gate runner 48 is connected to the gate conductive portion in the gate trench portion 40 at the front surface of the semiconductor substrate. The gate runner 48 is not electrically connected to the dummy conductive portion in the dummy trench portion 30 and the emitter electrode 52.

The gate runner 48 and the emitter electrode 52 are electrically separated by an insulator such as the interlayer dielectric film and an oxide film. The gate runner 48 of the present example is provided from a position below the contact hole 49 to an edge portion 41 of the gate trench portion 40. At the edge portion 41 of the gate trench portion 40, the gate conductive portion is exposed at the front surface of the semiconductor substrate, and is connected to the gate runner 48.

The emitter electrode 52 and the gate metal layer 50 are formed of a conductive material including metal. For example, the emitter electrode and the gate metal layer are formed of an alloy containing aluminum or aluminum as a main component (for example, an aluminum-silicon alloy or the like). Each electrode may have barrier metal formed of titanium, a titanium compound, or the like in a lower layer of a region formed of aluminum or the like. The electrodes of the present example are the emitter electrode 52 and the gate metal layer 50, respectively.

Each electrode may have a plug formed of tungsten or the like in the contact hole. The plug may have the barrier metal on a side in contact with the semiconductor substrate and have tungsten embedded to be in contact with the barrier metal, and may be formed of aluminum or the like on tungsten.

It should be noted that the plug is provided in the contact hole in contact with the contact region 15 or the base region 14. In addition, below the contact hole of the plug, a plug region 17 of the P++ type having a doping concentration higher than that of the contact region 15 may be provided. The plug region 17 improves latch-up capability by improving a contact resistance between the barrier metal and the contact region 15.

The well region 11 overlaps the gate runner 48 to extend in the outer circumference of the active portion 160, and is annularly provided in the top view. The well region 11 extends in a predetermined width even within a range that does not overlap the gate runner 48 and is annularly provided in the top view. The well region 11 of the present example is provided away from an end of the contact hole 54 in a Y axis direction toward a gate runner 48 side. The well region 11 is a region of a second conductivity type in which the doping concentration is higher than that of the base region 14. The gate runner 48 is electrically insulated from the well region 11.

In the present example, the base region 14 is the P− type, and the well region 11 is the P+ type. In addition, the well region 11 is formed from the front surface of the semiconductor substrate to a position deeper than a lower end of the base region 14. The base region 14 may be provided in contact with the well region 11. Therefore, the well region 11 is electrically connected to the emitter electrode 52.

The transistor portion 70 has a plurality of trench portions arrayed in an array direction. In the transistor portion 70 of the present example, one or more gate trench portions 40 are provided along the array direction.

The gate trench portion 40 of the present example may have two linear portions 39 extending along an extension direction perpendicular to the array direction (portions of a trench that are linear along the extension direction), and the edge portion 41 connecting the two linear portions 39.

At least a part of the edge portion 41 may be provided in a curved shape in the top view. The edge portion 41 connects end portions of the two linear portions 39 in the Y axis direction to the gate runner 48, which functions as a gate electrode to the gate trench portion 40. On the other hand, by forming the edge portion 41 into a curved shape, the electric field concentration at the end portions can be further relaxed, as compared with a case where the gate trench portion 40 is completed with the linear portions 39.

In the transistor portion 70 of another example, one or more gate trench portions 40 and one or more dummy trench portions 30 may be alternately provided along the array direction. In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided.

In addition, the dummy trench portion 30 may not be provided and the gate trench portion 40 may be provided between the respective linear portions 39. With such a structure, the electron current from the emitter region 12 can be increased, so that an On voltage is reduced.

The dummy trench portion 30 may have a linear shape extending in the extension direction, and may have linear portions 29 and an edge portion 31, similar to the gate trench portion 40. In the semiconductor device 100 shown in FIG. 1, only the dummy trench portion 30 having the edge portion 31 is arrayed; however, in another example, the semiconductor device 100 may include the dummy trench portion 30 with a linear shape that does not have the edge portion 31.

A diffusion depth of the well region 11 may be deeper than depths of the gate trench portion 40 and the dummy trench portion 30. End portions of the gate trench portion 40 and the dummy trench portion 30 in the Y axis direction are provided in the well region 11 in the top view. In other words, a bottom portion in the depth direction of each trench portion is covered with the well region 11 at the end portion in the Y axis direction of each trench portion. In addition, the trench portion provided at the end portion in an X axis direction may be covered with the well region 11. With this configuration, the electric field concentration in the bottom portion of each trench portion can be relaxed.

A mesa portion is provided between the respective trench portions in the array direction. The mesa portion refers to a region sandwiched between the trench portions in the semiconductor substrate. As an example, a depth position of the mesa portion is from the front surface of the semiconductor substrate to the bottom portion of the trench portion. The mesa portion of the present example is sandwiched between trench portions that are adjacent to each other in the X axis direction, and is provided to extend in the extension direction (the Y axis direction) along the trench at the front surface of the semiconductor substrate.

Each mesa portion is provided with the base region 14. In each mesa portion, at least one of the emitter region 12 of a first conductivity type or the contact region 15 of the second conductivity type may be provided in a region sandwiched between the base regions 14 in the top view. The emitter region 12 of the present example is the N+ type, and the contact region 15 is the P+ type. The emitter region 12 and the contact region 15 may be provided between the base region 14 and the front surface of the semiconductor substrate in the depth direction.

The mesa portion has the emitter region 12 exposed at the front surface of the semiconductor substrate. The emitter region 12 is provided in contact with the gate trench portion 40. The mesa portion in contact with the gate trench portion 40 is provided with the contact region 15 exposed at the front surface of the semiconductor substrate.

Each of the contact region 15 and the emitter region 12 in the mesa portion is provided from one trench portion to the other trench portion in the X axis direction. As an example, the contact region 15 and the emitter region 12 of the mesa portion are alternately arranged along the extension direction (the Y axis direction) of the trench portion.

In another example, the contact region 15 and the emitter region 12 of the mesa portion may be provided in a stripe shape along the extension direction (the Y axis direction) of the trench portion. For example, the emitter region 12 is provided in a region in contact with the trench portion, and the contact region 15 is provided in a region sandwiched between the emitter regions 12.

The contact hole 54 is provided above each mesa portion. The contact hole 54 is arranged in the region sandwiched between the base regions 14 in its extension direction (the Y axis direction). The contact hole 54 of the present example is provided above respective regions of the contact region 15, the base region 14, and the emitter region 12. The contact hole 54 may be arranged at the center of the mesa portion in the array direction (the X axis direction).

Figure 2A:
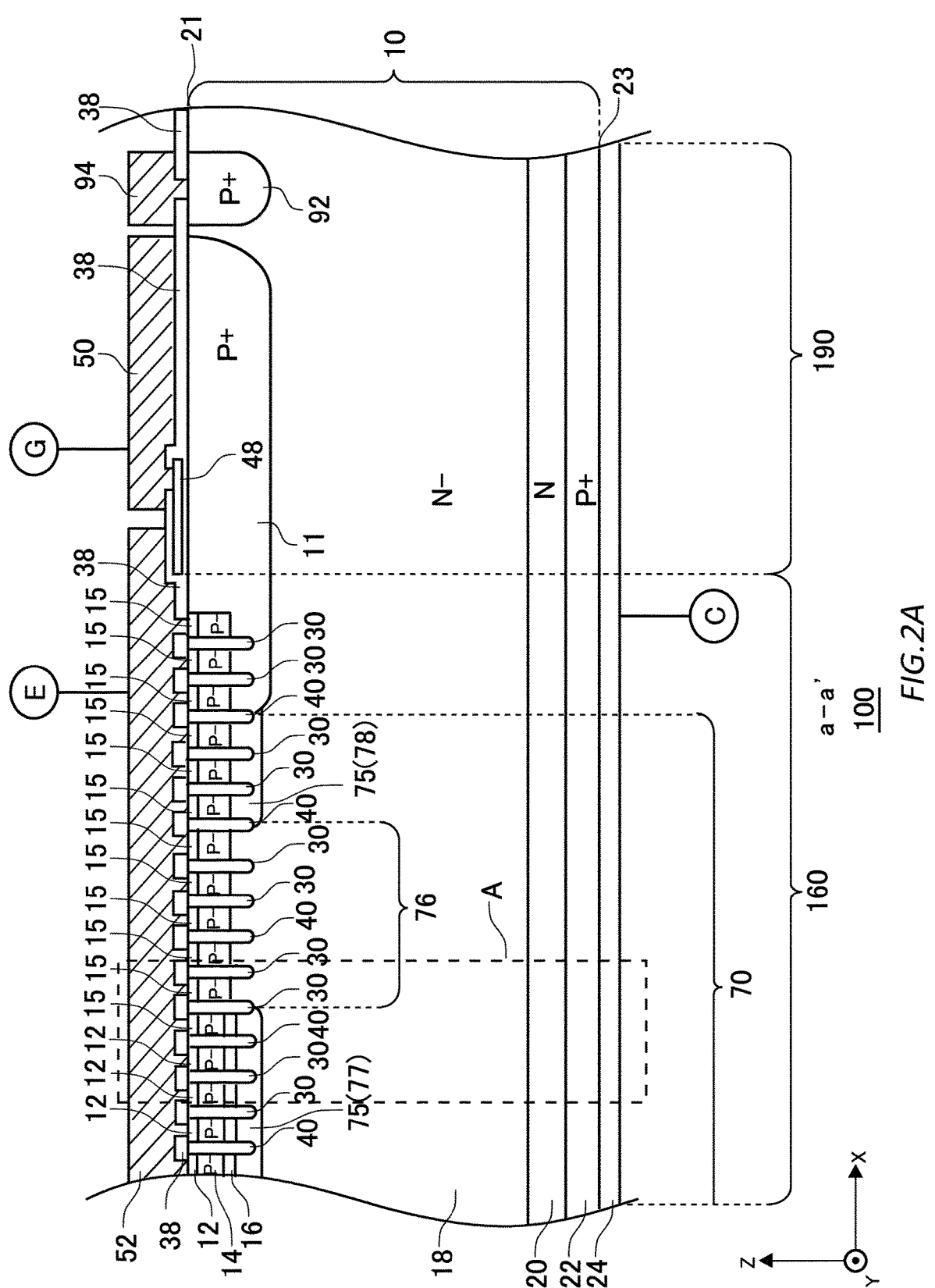
FIG. 2A is a figure showing an example of a cross section a-a' in FIG. 1.
Figure 2B:
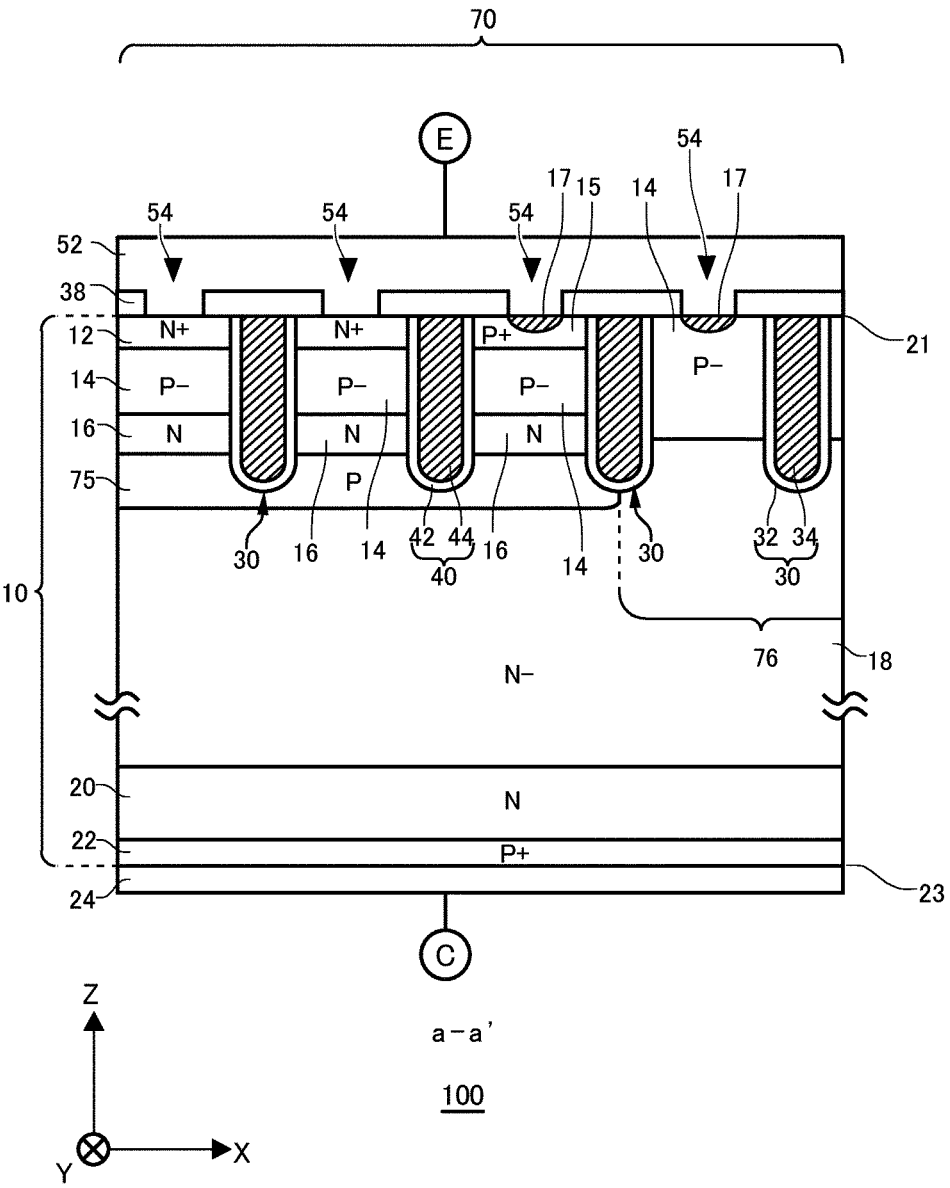
FIG. 2B is an enlarged drawing of a region A in FIG. 2A.

FIG. 2A is a figure showing an example of a cross section a-a' in FIG. 1. FIG. 2B is an enlarged drawing of a region A in FIG. 2A. The cross section a-a' is an XZ plane passing through the emitter region 12, the contact region 15, the base region 14, and the gate trench portion 40 and the dummy trench portion 30. In the cross section a-a', the semiconductor device 100 of the present example has the semiconductor substrate 10, an interlayer dielectric film 38, the emitter electrode 52, and a collector electrode 24.

The edge termination structure portion 190 may have a guard ring 92. The guard ring 92 is a region of the P type in contact with the front surface of the semiconductor substrate. The guard ring 92 is electrically connected to the field plate 94. It should be noted that the edge termination structure portion 190 of the present example has a plurality of guard rings, but it is omitted in FIG. 2A, and only one guard ring 92 is shown. By providing the plurality of guard rings 92, a depletion layer in an upper surface side of the active portion 160 can be extended outward, and a breakdown voltage of the semiconductor device 100 can be improved.

The interlayer dielectric film 38 is provided to a front surface 21 of the semiconductor substrate 10. The interlayer dielectric film 38 is the dielectric film such as silicate glass to which the impurities such as boron or phosphorus are added. The interlayer dielectric film 38 may be in contact with the front surface 21, or another film such as an oxide film may be provided between the interlayer dielectric film 38 and the front surface 21. The interlayer dielectric film 38 is provided with the contact hole 54 described in FIG. 1.

The emitter electrode 52 is provided at the front surface 21 of the semiconductor substrate 10 and an upper surface of the interlayer dielectric film 38. The emitter electrode 52 is electrically connected to the front surface 21 through the contact hole 54 of the interlayer dielectric film 38. The plug region 17 of tungsten (W) or the like may be provided inside the contact hole 54. The collector electrode 24 is provided on a back surface 23 of the semiconductor substrate 10. The emitter electrode 52 and the collector electrode 24 are formed of a material including metal or a laminated film thereof.

The semiconductor substrate 10 may be a silicon substrate, may be a silicon carbide substrate, or may be a nitride semiconductor substrate or the like of gallium nitride or the like. The semiconductor substrate 10 of the present example is the silicon substrate.

The semiconductor substrate 10 has a drift region 18 of the first conductivity type. The drift region 18 of the present example is the N– type. The drift region 18 may be a remaining region in the semiconductor substrate 10, in which other doping regions are not provided.

Above the drift region 18, one or more accumulation regions 16 may be provided in the Z axis direction. The accumulation region 16 is a region in which the same dopant as that of the drift region 18 is accumulated at a concentration higher than that of the drift region 18. The doping concentration of the accumulation region 16 is higher than the doping concentration of the drift region 18. The accumulation region 16 of the present example is the N type. With the provision of the accumulation region 16, it is possible to increase an injection enhancement effect (IE effect) of a carrier so as to lower the ON voltage.

The accumulation region 16 of the present example has a doping concentration in which at least one half width is 0.3 μm or more. In the accumulation region 16, the one half width of the doping concentration may be 2.7 μm or less. The accumulation region 16 has a doping concentration with a half width of 0.3 μm or more, from a peak position of the doping concentration to a back surface 23 side of the semiconductor substrate 10, in the depth direction (the −Z axis direction) of the semiconductor substrate 10. A peak doping concentration of the accumulation region 16 is $1.8E16$ cm$^{-3}$ or more and $1.9E17$ cm$^{-3}$ or less. The dopant of the accumulation region 16 is, as an example, arsenic (As), phosphorus (P), antimony (Sb), or the like.

The accumulation region 16 of the present example is provided, in the array direction (the X axis direction), to extend from a side wall of the trench portion to a side wall of a trench portion that is adjacent. That is, the accumulation region 16 is provided to extend over the entire mesa portion in the array direction (the X axis direction). In another example, the accumulation region 16 may be provided to extend in only a part of the mesa portion in the array direction (the X axis direction).

The accumulation region 16 of the present example may be provided between the base region 14 and a trench bottom portion 75 that is described below. A thickness of the accumulation region 16 in the depth direction (the −Z axis direction) is 2.5 μm or more and 4.0 μm or less. In the accumulation region 16 of the present example, an upper end is in contact with the base region 14, and a lower end is in contact with the trench bottom portion 75.

Above the base region 14, the emitter region 12 is provided in contact with the front surface 21 of the semiconductor substrate 10. The emitter region 12 is provided in contact with the gate trench portion 40. A doping concentration of the emitter region 12 is higher than the doping concentration of the drift region 18. The dopant of the emitter region 12 is, as an example, arsenic (As), phosphorus (P), antimony (Sb), or the like.

A buffer region 20 of the first conductivity type may be provided below the drift region 18. The buffer region 20 of the present example is the N type. A doping concentration of the buffer region 20 is higher than the doping concentration of the drift region 18. The buffer region 20 may function as a field stop layer which prevents a depletion layer extending from a lower surface side of the base region 14, from reaching a collector region 22.

The collector region 22 is provided below the buffer region 20.

In the semiconductor substrate 10, the gate trench portion 40 and the dummy trench portion 30 are provided. The gate trench portion 40 and the dummy trench portion 30 are provided to pass through the base region 14 and the accumulation region 16 from the front surface 21, and reach the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

The gate trench portion 40 has a gate trench, a gate dielectric film 42, and a gate conductive portion 44 that are provided at the front surface 21 of the semiconductor substrate 10. The gate dielectric film 42 is provided covering an inner wall of the gate trench. The gate dielectric film 42 may be formed of an oxide film or a nitride film. The gate conductive portion 44 is provided to be embedded on an inner side further than the gate dielectric film 42 inside the gate trench. An upper surface of the gate conductive portion 44 may be in the same XY plane as the front surface 21. The gate dielectric film 42 insulates the gate conductive portion 44 from the semiconductor substrate 10. The gate conductive portion 44 is formed of polysilicon doped with impurities, or the like.

The gate conductive portion 44 may be provided longer than the base region 14 in the depth direction. The gate trench portion 40 is covered with the interlayer dielectric film 38 at the front surface 21. When a predetermined voltage is applied to the gate conductive portion 44, a channel is formed to a surface layer being at a boundary within the base region 14 and in direct contact with the gate trench, due to an electron inversion layer.

The dummy trench portion 30 may have the same structure as that of the gate trench portion 40 in a cross section XZ. The dummy trench portion 30 has a dummy trench, a dummy dielectric film 32, and a dummy conductive portion 34 that are provided at the front surface 21 of the semiconductor substrate 10. The dummy dielectric film 32 is provided covering an inner wall of the dummy trench. The dummy dielectric film 32 may be formed of an oxide film or a nitride film. The dummy conductive portion 34 is provided to be embedded on an inner side further than the dummy dielectric film 32 inside the dummy trench. An upper surface of the dummy conductive portion 34 may be in the same XY plane as the front surface 21. The dummy dielectric film 32 insulates the dummy conductive portion 34 from the semiconductor substrate 10. The dummy conductive portion 34 may be formed of the same material as that of the gate conductive portion 44.

The gate trench portion 40 and the dummy trench portion 30 of the present example are covered with the interlayer dielectric film 38 at the front surface 21 of the semiconductor substrate 10. It should be noted that the bottom portions of the dummy trench portion 30 and the gate trench portion 40 may have curved surfaces which are convex downward (curved shapes in cross sections XZ).

in the bottom portion of the trench portion, the trench bottom portion 75 of the P type is provided. The trench bottom portion 75 of the present example is provided below the accumulation region 16. In the depth direction of the semiconductor substrate 10, a lower end of the trench bottom portion 75 may be positioned below the bottom portion of the gate trench portion 40. In other words, the trench bottom portion 75 may cover the bottom portion of the gate trench portion 40.

A doping concentration of the trench bottom portion 75 is higher than the doping concentration of the drift region 18 and is lower than the doping concentration of the base region 14. The doping concentration of the trench bottom portion 75 is, for example, $3.0E16$ cm$^{-3}$ or more and $2.0E17$ cm$^{-3}$ or less.

In FIG. 2A and FIG. 2B, an end portion of the trench bottom portion 75 on a positive side (an edge termination structure portion 190 side) of the X axis direction coincides with an end portion of the accumulation region 16 on the positive side in the X axis direction, but may extend further toward the edge termination structure portion 190 side.

The trench bottom portion 75 may be a floating layer which is electrically floating. In the present specification, the floating layer refers to a layer which is not electrically connected to any of electrodes such as the emitter electrode 52. With the provision of the trench bottom portion 75, the turn-on characteristic of the transistor portion 70 is improved. In addition, with the provision of the trench bottom portion 75, the electric field concentration in the bottom portion of the gate trench portion 40 is relaxed, and the avalanche capability is improved.

The transistor portion 70 may have, in the top view, an electron passing region 76 in which the trench bottom portion 75 is not provided. The electron passing region 76 is not provided with the accumulation region 16. In addition, the trench bottom portion 75 may have, in the top view: a first trench bottom portion 77 that is provided in a center portion side of the active portion 160 relative to the electron passing region 76 and that is electrically floating; and a second trench bottom portion 78 that is provided in the edge termination structure portion 190 side relative to the electron passing region 76 and that is in contact with the well region 11. Above the second trench bottom portion 78, the accumulation region 16 may not be provided.

The electron passing region 76 separates the first trench bottom portion 77, from the second trench bottom portion 78 fixed to an emitter potential, to cause the electrical floating, so that the electrons can flow through the first trench bottom portion 77 when the electricity is conducted in the transistor portion 70. in addition, the accumulation region 16 is not provided in the electron passing region 76, so that the electrons can flow through the electron passing region 76 when the electricity is conducted in the transistor portion 70.

Figure 3:
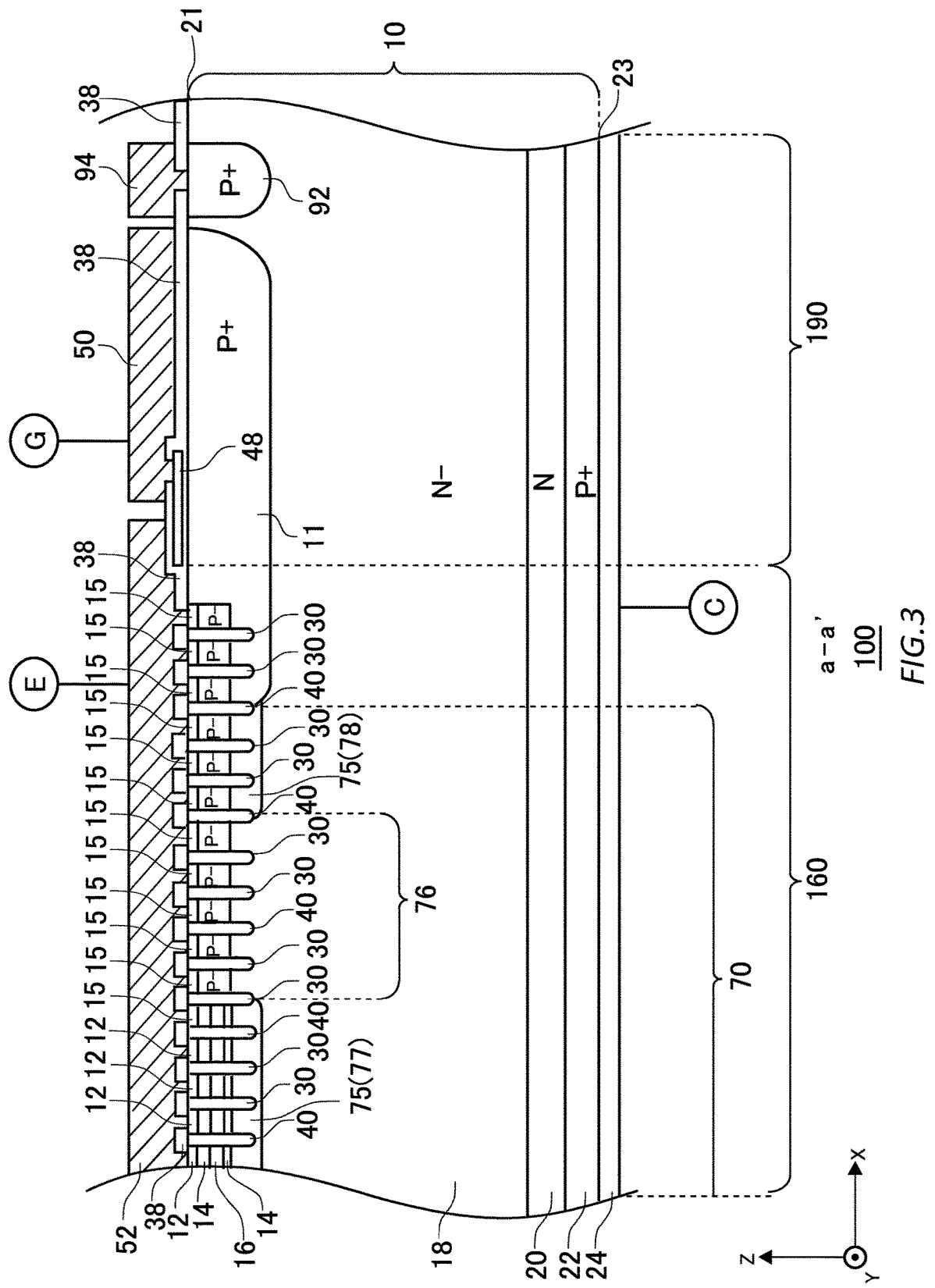
FIG. 3 is a figure showing another example of the cross section a-a' in FIG. 1.

FIG. 3 is a figure showing another example of the cross section a-a' in FIG. 1. Here, a difference from FIG. 2A will be mainly described, and the descriptions of common parts will be omitted.

The lower end of the accumulation region 16 in the present example is spaced apart from the trench bottom portion 75. That is, in the depth direction (the −Z axis direction) of the semiconductor substrate 10, the accumulation region 16 is sandwiched between the base regions 14, and the base region 14 is interposed between the accumulation region 16 and the trench bottom portion 75. Even with such a configuration, it is possible to obtain an effect similar to that in the example of FIG. 2A.

Figure 4:
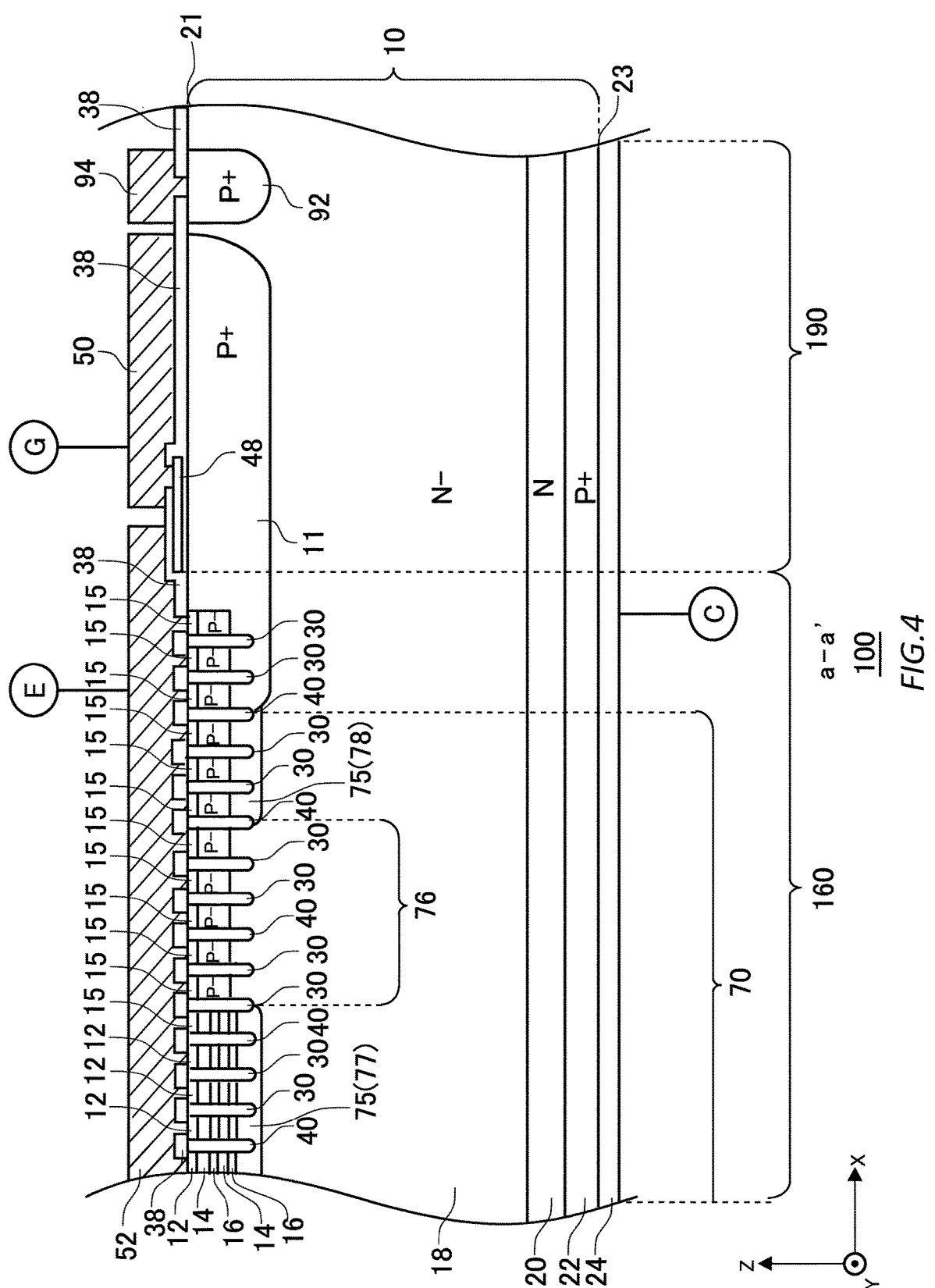
FIG. 4 is a figure showing another example of the cross section a-a' in FIG. 1.

FIG. 4 is a figure showing another example of the cross section a-a' in FIG. 1. Here, a difference from FIG. 2A will be mainly described, and the descriptions of common parts will be omitted.

The accumulation region 16 of the present example is provided as a plurality of layers. In FIG. 4, two layers of accumulation regions 16 are provided in the depth direction (the −Z axis direction) of the semiconductor substrate 10, and are separated from each other by the base region 14 interposed between these. Even with such a configuration, it is possible to obtain an effect similar to that in the example of FIG. 2A.

It should be noted that the lower end of the accumulation region 16 of a lower layer is in contact with the trench bottom portion 75 in FIG. 4, but may be spaced apart from the trench bottom portion 75 as shown in FIG. 3.

Figure 5:
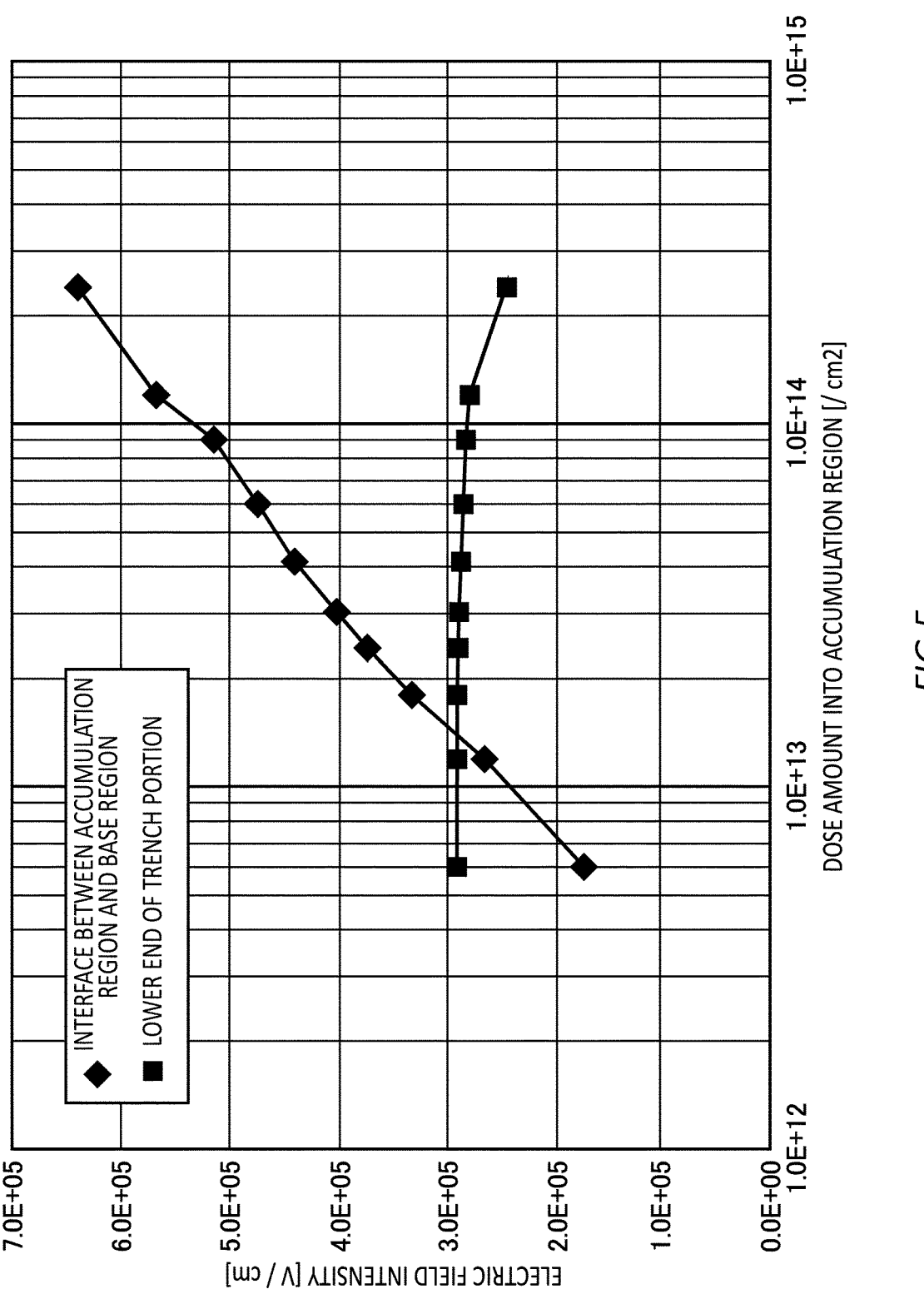
FIG. 5 is a figure showing a relationship between a dose amount and an electric field intensity in an accumulation region of a semiconductor device according to a comparison example.

FIG. 5 is a figure showing a relationship between a dose amount and an electric field intensity in an accumulation region of a semiconductor device according to a comparison example. In FIG. 5, a horizontal axis represents the dose amount [cm-] of the dopant implanted into the accumulation region, and a vertical axis represents an electric field intensity [V/cm] at an interface between the accumulation region and the base region, and an electric field intensity [V/cm] in the bottom portion of the trench portion.

It should be noted that in the semiconductor device according to the comparison example, the accumulation region is formed by implanting ions of the dopant perpendicularly to the front surface of the semiconductor substrate, from above the front surface of the semiconductor substrate.

Typically, the higher the doping concentration of the accumulation region is, the higher the obtained IE effect is. Note that in the transistor portion, a reverse surge voltage is generated at a time of turn off to be maintained for a certain period of time, and then the voltage decreases and is maintained at a certain value. A state in which the surge voltage is maintained may be referred to as a clamp state, and the period of time may be referred to as a period of clamp capability.

The surge voltage is fixed near a maximum electric field intensity determined by the breakdown voltage of silicon of the semiconductor substrate. Typically, the electric field intensity in the clamp state is maximum near the bottom portion of the trench portion. When a voltage exceeding the maximum electric field intensity is applied to the bottom portion of one trench portion, an avalanche current flows, and when the breakdown voltage increases due to a temperature rise, the avalanche current disappears. Then, the avalanche current moves to a bottom portion of a trench portion that is adjacent and that has a lower breakdown voltage. When the maximum electric field intensity is near the bottom portion of the trench portion, the clamp state is maintained by a phenomenon in which such an avalanche current moves is repeated.

However, the higher the peak doping concentration of the accumulation region is, the higher the electric field intensity is at a PN junction at the interface between the accumulation region and the base region. Referring to FIG. 5, near a dose amount of 1.5E13 cm$^{-2}$, the electric field intensity at the interface between the accumulation region and the base region exceeds the electric field intensity in the bottom portion of the trench portion. That is, when the dose amount of the accumulation region exceeds 1.5E13 cm$^{-2}$ and the electric field intensities are reversed, the phenomenon in which the avalanche current moves in the bottom portions of the plurality of trench portions does not occur, and the clamp capability of the semiconductor device decreases.

Figure 6:
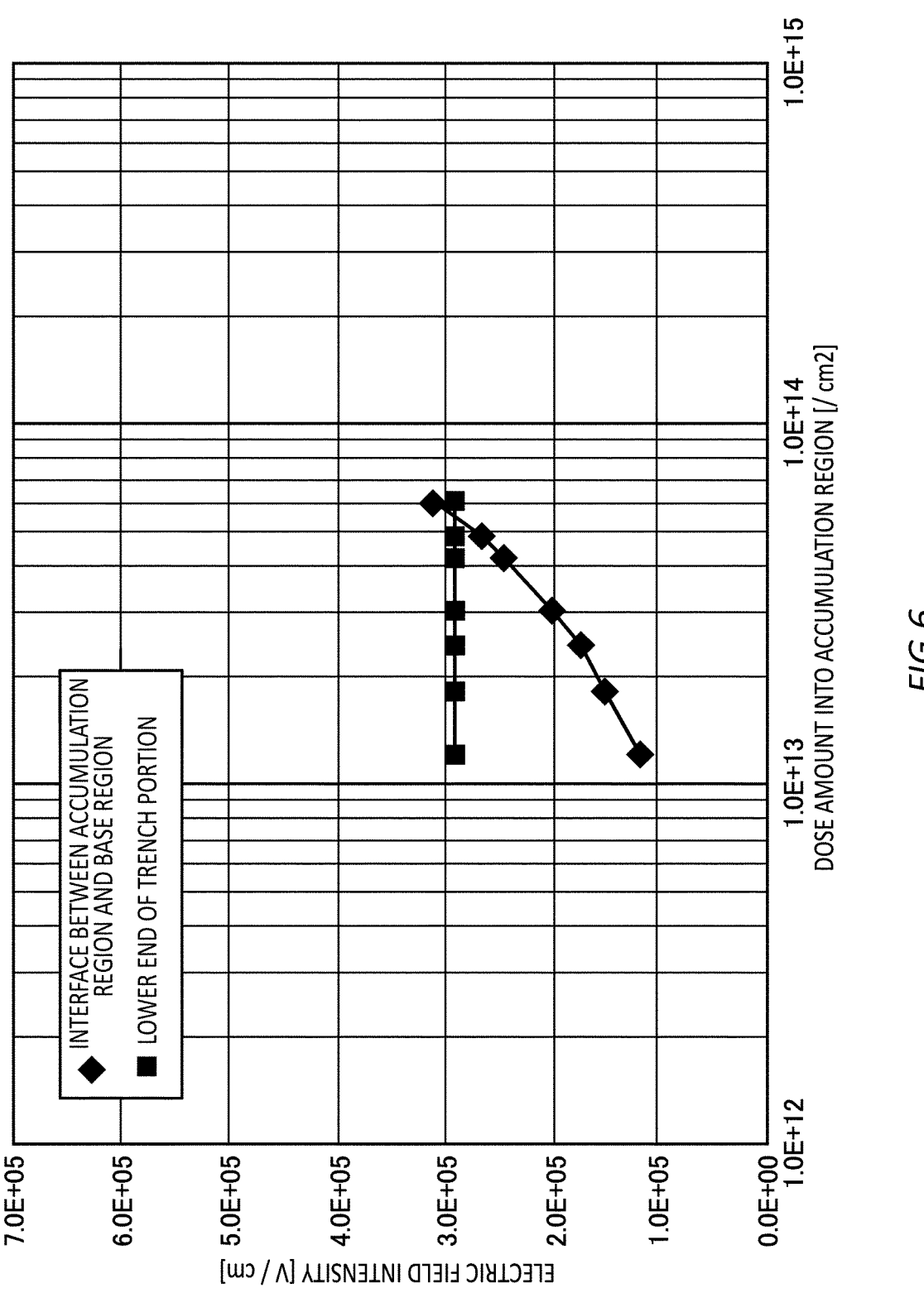
FIG. 6 is a figure showing a relationship between a dose amount and an electric field intensity in an accumulation region 16 of the semiconductor device 100 according to an example embodiment.

FIG. 6 is a figure showing a relationship between a dose amount and an electric field intensity in an accumulation region 16 of the semiconductor device 100 according to an example embodiment. The vertical axis and the horizontal axis are similar to those in FIG. 5.

The accumulation region 16 of the present example has a doping concentration in which at least one half width is 0.3 μm or more. In the accumulation region 16, the one half width of the doping concentration may be 2.7 μm or less. The accumulation region 16 has a doping concentration with a half width of 0.3 μm or more, from the peak position of the doping concentration to the back surface 23 side of the semiconductor substrate 10, in the depth direction (the −Z axis direction) of the semiconductor substrate 10. The peak doping concentration of the accumulation region 16 is 1.8E16 cm-3 or more and 1.9E17 cm$^{-3}$ or less. The dopant of the accumulation region 16 is, as an example, arsenic (As), phosphorus (P), antimony (Sb), or the like.

It should be noted that in order to form the accumulation region 16 having such a doping concentration distribution, the accumulation region 16 of the present example is formed by implanting the ions from the side wall of the trench portion into the mesa portion of the semiconductor substrate 10, at an implantation angle inclined with respect to the front surface 21 of the semiconductor substrate 10, and the details will be described below.

Referring to FIG. 6, the electric field reversal in which the electric field intensity at the interface between the accumulation region and the base region exceeds the electric field intensity in the bottom portion of the trench portion, occurs near a dose amount of 5.5E13 cm$^{-2}$. That is, in the present example, the accumulation region can be formed by the dopant having a dose amount greater than that of the comparison example of FIG. 5 without decreasing the clamp capability, so that the IE effect can be enhanced.

Figure 7A:
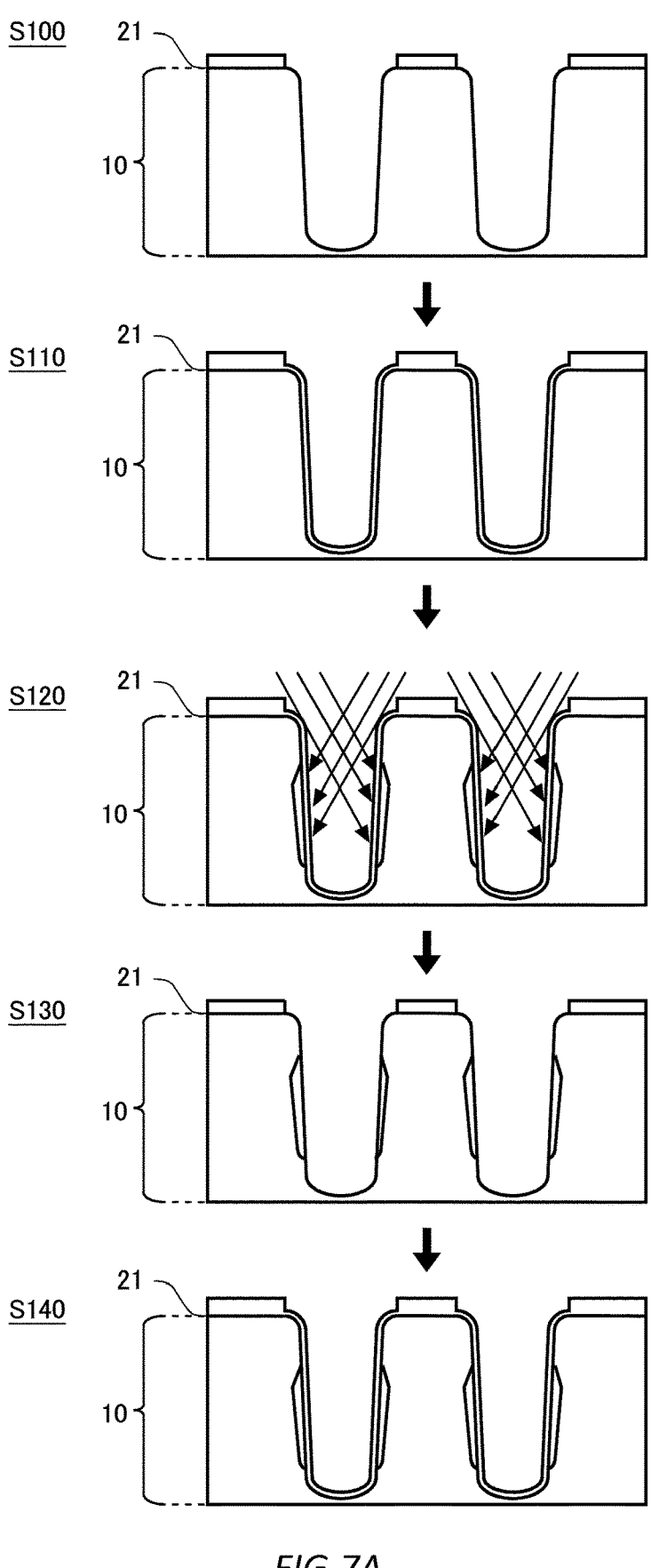
FIG. 7A is a figure showing an example of a manufacturing method of the semiconductor device 100 according to an example embodiment.
Figure 7B:
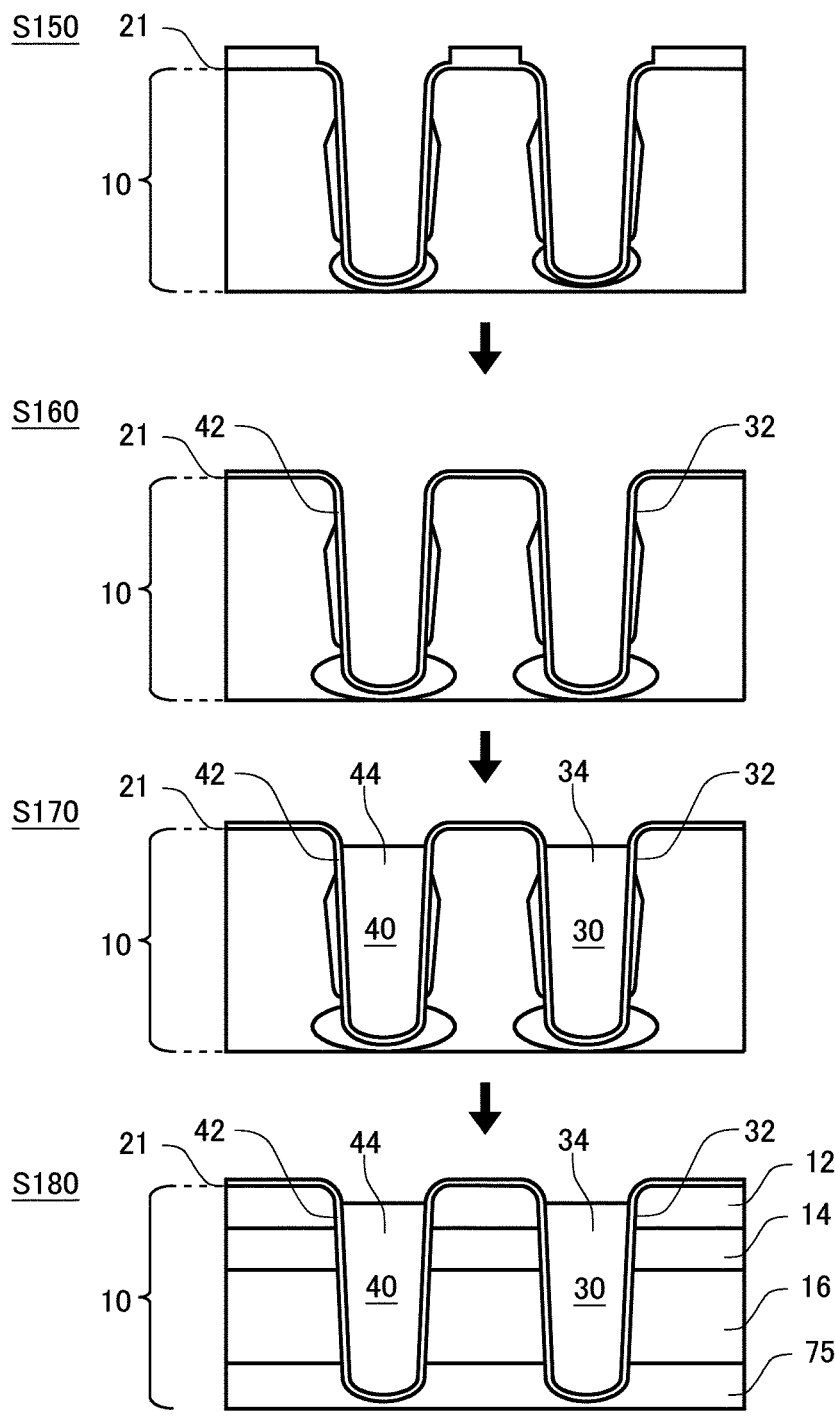
FIG. 7B is a figure showing an example of the manufacturing method of the semiconductor device 100 according to an example embodiment.

FIG. 7A and FIG. 7B are figures showing examples of manufacturing methods of the semiconductor device 100 according to an example embodiment. Here, processes relating to a formation of the accumulation region 16 and the trench bottom portion 75 will be mainly described, and the description of other processes will be omitted.

In step S100, the plurality of trench portions is formed by etching the front surface 21 of the semiconductor substrate 10. The trench portion is formed by the etching to a depth reaching a region (a remaining region in which other doping regions are not provided in a later doping region formation step) that serves as the drift region 18. Next, in step S110, oxide films with a thickness of 30 nm to 40 nm are formed on the side walls of the plurality of trench portions.

In step S120, the ions of the dopant of the N type are implanted to form the accumulation region 16. The dopant of the accumulation region 16 is, as an example, arsenic (As), phosphorus (P), antimony (Sb), or the like, and the dose amount is 6E11 cm$^{-2}$ or more and 5.5E13 cm$^{-2}$ or less. In the present example, the ions are implanted from the side walls of the plurality of trench portions into the mesa portions via the oxide films, at the implantation angle inclined with respect to the front surface 21 of the semiconductor substrate 10. A mask may be formed on the bottom portion of the trench portion before the ion implantation to suppress the ion implantation near the bottom portion of the trench portion.

The implantation angle may be changed according to the depth position at which the accumulation region 16 is formed. Alternatively, in one side wall and the other side wall of the trench portion, the ions may be implanted at implantation angles different from each other. Alternatively, the ions may be implanted from one side wall of the trench portion and the ion implantation may not be performed on the other side wall.

In step S130, the oxide films are removed from the side walls of the plurality of trench portions. This removes damage caused by the ion implantation. Next, in step S140, the oxide films are formed on the side walls of the plurality of trench portions. This prevents leakage from the gate trench portion 40.

In step S150, the ions of the dopant of the P type are implanted to form the trench bottom portion 75. In the present example, the ions of the dopant are implanted perpendicularly from above the plurality of trench portions toward the bottom portion of the trench portion. The dose amount may be appropriately adjusted to be a predetermined doping concentration.

In step S160, the oxide films are removed from the side walls of the plurality of trench portions, and then the oxide films are formed on the side walls of the plurality of trench portions. These oxide films serve as the dummy dielectric film 32 and the gate dielectric film 42.

In step S170, the plurality of trench portions whose side walls are covered with the dummy dielectric film 32 and the gate dielectric film 42 is filled with polysilicon doped with the impurities or the like, to form the dummy conductive portion 34 and the gate conductive portion 44, respectively. Excess polysilicon or the like deposited on the front surface 21 of the semiconductor substrate 10 is removed by the etching, to form the dummy trench portion 30 and the gate trench portion 40.

In step S180, the ions of the dopant are implanted into the front surface 21 of the semiconductor substrate 10 to form the base region 14 or the like, and then the doping region is formed by thermal diffusion. In this manner, the doping region such as the base region 14, the emitter region 12, the contact region 15, and the like is formed, in addition to the accumulation region 16 and the trench bottom portion 75.

In the present example, the formation step (the ion implantation) of the base region 14 is performed after the formation step (the ion implantation) of the accumulation region 16; however, the formation step of the accumulation region 16 may be performed after the formation step of the base region 14. As an example, in the depth direction of the semiconductor substrate 10, in a case where the base region 14 is interposed between the accumulation region 16 and the trench bottom portion 75 (FIG. 3), or in a case where the plurality of layers of accumulation regions 16 is formed (FIG. 4), the step of forming the base region 14 is performed before step S120 of FIG. 7A.

Figure 8:
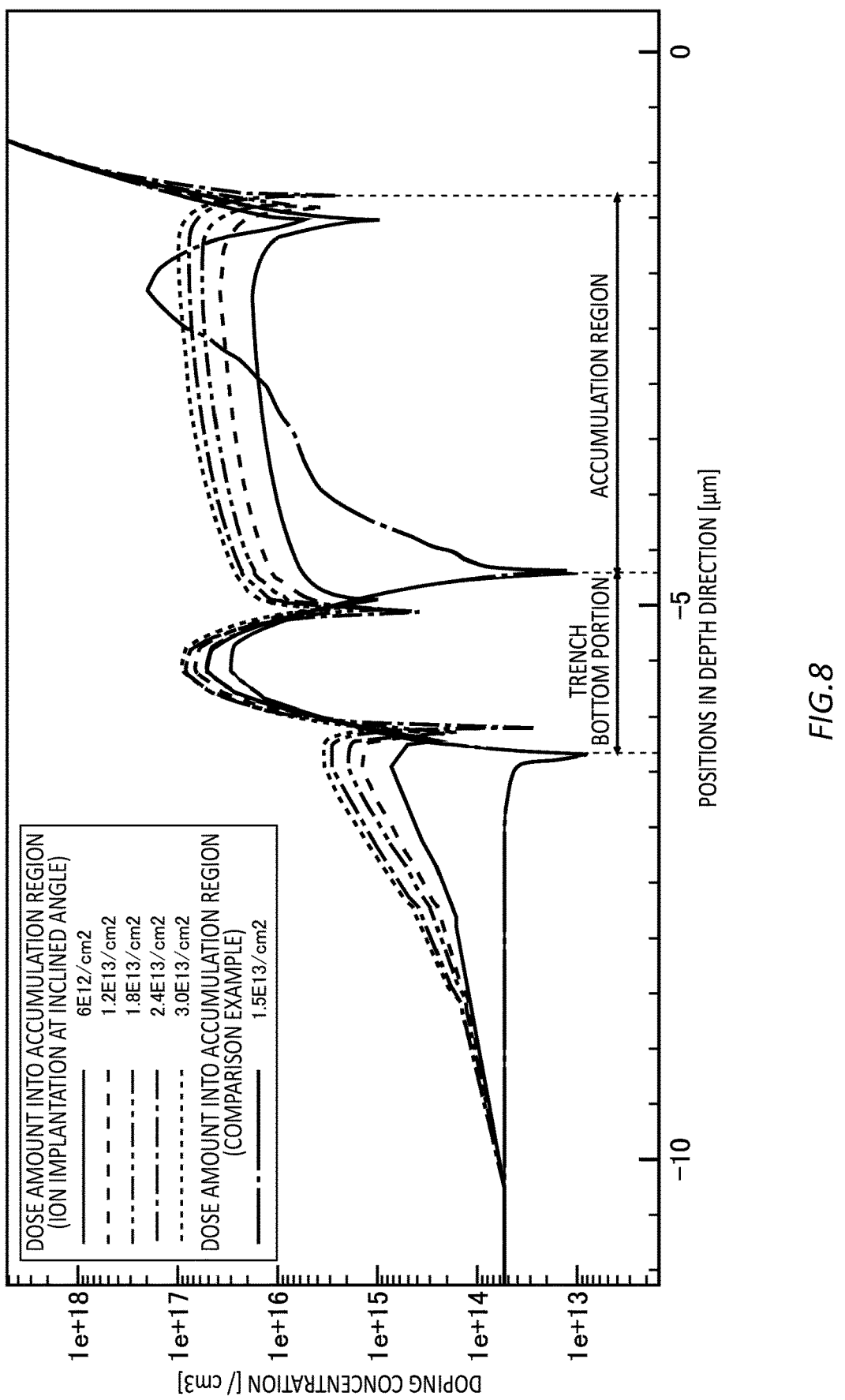
FIG. 8 is a figure showing a relationship between the dose amount and a doping concentration in the accumulation region and a trench bottom portion of the semiconductor device according to an example embodiment and a comparison example.

FIG. 8 is a figure showing a relationship between the dose amount and a doping concentration in the accumulation region and a trench bottom portion of the semiconductor device according to an example embodiment and a comparison example. The horizontal axis indicates positions [μm] in the depth direction of the semiconductor substrate 10, and the vertical axis indicates doping concentration distributions [cm$^{-3}$] of the accumulation regions formed with the dopants of dose amounts different from each other. The positions in the depth direction are the positions in the Z axis direction in which the front surface of the semiconductor substrate 10 is set as 0.

The semiconductor device 100 according to the example embodiment is manufactured by the manufacturing methods described with reference to FIG. 7A and FIG. 7B, and the dose amounts in the accumulation region 16 are 6E12 cm$^{-2}$, 1.2E13 cm$^{-2}$, 1.8E13 cm$^{-2}$, 2.4E13 cm$^{-2}$, and 3.0E13 cm$^{-2}$. The dose amount in the accumulation region of the semiconductor device according to the comparison example is 1.5E13 cm$^{-2}$. Similar to FIG. 5, in the semiconductor device according to the comparison example, the accumulation region is formed by implanting the ions of the dopant perpendicularly to the front surface of the semiconductor substrate, from above the front surface of the semiconductor substrate.

With reference to FIG. 8, in the depth direction, the accumulation region is formed approximately in a range of −2 μm to −5 μm, and the trench bottom portion is formed approximately in a range of −5 μm to −8 μm. The thickness of the accumulation region 16 in the depth direction of the semiconductor device 100 according to the example embodiment is 2.5 μm or more and 4.0 μm or less.

The greater the dose amount is, the higher the doping concentration of the accumulation region 16 is, and any doping concentration has a peak in the front surface 21 side of the semiconductor substrate 10 (near the interface with the base region 14). The accumulation region 16 has a doping concentration with a half width of 0.3 μm or more, from the peak position of the doping concentration to the back surface 23 side of the semiconductor substrate 10, in the depth direction of the semiconductor substrate 10. The peak doping concentration of the accumulation region 16 is 1.8E16 cm$^{-3}$ or more and 1.9E17 cm$^{-3}$ or less.

On the other hand, the peak doping concentration of the accumulation region according to the comparison example is 2.0E17 cm$^{-3}$, which is higher than the peak doping concentration of any accumulation region 16 according to the example embodiment. In addition, the half width of the doping concentration of the accumulation region according to the comparison example is 2.7 μm, which is smaller than the half width of any accumulation region 16 according to the example embodiment. That is, the doping concentration of the accumulation region 16 according to the example embodiment has a smaller peak and a broader profile than those of the accumulation region according to the comparison example.

In this way, with the example embodiment, in order to form the accumulation region 16, by implanting ions from the side wall of the trench portion into the mesa portion of the semiconductor substrate 10, at the implantation angle inclined with respect to the front surface 21 of the semiconductor substrate 10, it is possible to reduce the peak doping concentration, and decrease the electric field intensity at the interface between the accumulation region 16 and the base region 14 to prevent the decrease of the clamp capability, and increase an integrated concentration in the accumulation region 16 to enhance the IE effect.

In addition, the doping concentration of the trench bottom portion 75 according to the example embodiment is, for example, 3.0E16 cm$^{-3}$ or more and 2.0E17 cm$^{-3}$ or less. In the example embodiment, in order to form the accumulation region 16, the ions are implanted from the side wall of the trench portion into the mesa portion of the semiconductor substrate 10, at the implantation angle inclined with respect to the front surface 21 of the semiconductor substrate 10, so that the region of the N type is formed also near the bottom portion of the trench portion and may cause the decrease in breakdown voltage by the electric field concentration. Therefore, by forming the trench bottom portion 75 with a doping concentration that offsets the dopant of the N type implanted near the bottom portion of the trench portion, it is possible to prevent the electric field concentration near the bottom portion of the trench portion and maintain the breakdown voltage.

While the present invention has been described by way of the embodiments, the technical scope of the present invention is not limited to the above described embodiments. It is apparent to persons skilled in the art that various alterations or improvements can be made to the above described embodiments. It is also apparent from the description of the claims that the embodiments to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

10: semiconductor substrate; 11: well region; 12: emitter region; 14: base region; 15: contact region; 16: accumulation region; 17: plug region; 18: drift region; 20: buffer region; 21: front surface; 22: collector region; 23: back surface; 24: collector electrode; 25: connection portion; 29: linear portion; 30: dummy trench portion; 31: edge portion; 32: dummy dielectric film; 34: dummy conductive portion; 38: interlayer dielectric film; 39: linear portion; 40: gate trench portion; 41: edge portion; 42: gate dielectric film; 44: gate conductive portion; 48: gate runner; 49: contact hole; 50: gate metal layer; 52: emitter electrode; 54: contact hole; 56: contact hole; 70: transistor portion; 75: trench bottom portion; 76: electron passing region; 77: first trench bottom portion; 78: second trench bottom portion; 92: guard ring; 94: field plate; 100: semiconductor device; 160: active portion; 190: edge termination structure portion.

What is claimed is:

1. A semiconductor device comprising a transistor portion, wherein
the transistor portion has:
a drift region of a first conductivity type provided in a semiconductor substrate;

a base region of a second conductivity type provided above the drift region;
an accumulation region of the first conductivity type provided above the drift region;
a plurality of trench portions provided to extend from a front surface of the semiconductor substrate to the drift region; and
a trench bottom portion of the second conductivity type provided in bottom portions of the plurality of trench portions, and
the accumulation region has a doping concentration with a half width of 0.3 μm or more.

2. The semiconductor device according to claim 1, wherein
the accumulation region has a doping concentration with a half width of 0.3 μm or more, from a peak position of the doping concentration to a back surface side of the semiconductor substrate, in a depth direction of the semiconductor substrate.

3. The semiconductor device according to claim 1, wherein
a thickness of the accumulation region is 2.5 μm or more and 4.0 μm or less.

4. The semiconductor device according to claim 1, wherein
a peak doping concentration of the accumulation region is 1.8E16 cm$^{-3}$ or more and 1.9E17 cm$^{-3}$ or less.

5. The semiconductor device according to claim 1, wherein
the accumulation region is provided, in a trench array direction, to extend from a side wall of a first trench portion of the plurality of trench portions to a side wall of a second trench portion that is adjacent.

6. The semiconductor device according to claim 1, wherein
a lower end of the accumulation region is in contact with the trench bottom portion.

7. The semiconductor device according to claim 1, wherein
a lower end of the accumulation region is spaced apart from the trench bottom portion.

8. The semiconductor device according to claim 1, wherein
the accumulation region has a first accumulation region, and a second accumulation region separated from the first accumulation region by the base region.

9. The semiconductor device according to claim 1, wherein
the transistor portion has, in a top view, an electron passing region in which the trench bottom portion is not provided, and
the accumulation region is not provided in the electron passing region.

10. The semiconductor device according to claim 9, comprising:
an active portion that has the transistor portion; and
an edge termination structure portion provided at an outer circumference of the active portion, wherein
a well region of the second conductivity type is provided in the semiconductor substrate, from at least a part of the active portion to the edge termination structure portion, and
the trench bottom portion has, in the top view,
a first trench bottom portion that is provided in a center portion side of the active portion relative to the electron passing region and that is electrically floating, and a second trench bottom portion that is provided in an edge termination structure portion side relative to the electron passing region and that is in contact with the well region.

\* \* \* \* \*